United States Patent [19]
Park et al.

[11] Patent Number: 5,973,961
[45] Date of Patent: Oct. 26, 1999

[54] DIVIDED BIT LINE SYSTEM FOR NON-VOLATILE MEMORY DEVICES

[75] Inventors: Fungioon Park; Hsi-Hsien Hung, both of Fremont; Ker-Ching Liu, Palo Alto, all of Calif.

[73] Assignee: Nexflash, Technologies, Inc., Santa Clara, Calif.

[21] Appl. No.: 09/007,398

[22] Filed: Jan. 15, 1998

[51] Int. Cl.⁶ .................................................. G11G 11/34
[52] U.S. Cl. ...................................... 365/185.13; 365/63
[58] Field of Search ................................ 365/185.13, 63

[56] References Cited

U.S. PATENT DOCUMENTS

| | | | |
|---|---|---|---|
| 5,283,758 | 2/1994 | Nakayama et al. | 365/185 |
| 5,554,867 | 9/1996 | Ajika et al. | 257/314 |
| 5,610,871 | 3/1997 | Hidaka | 365/230.03 |
| 5,682,343 | 10/1997 | Tomishima et al. | 365/63 |

*Primary Examiner*—David Nelms
*Assistant Examiner*—M. Tran

*Attorney, Agent, or Firm*—Pennie & Edmonds, LLP

[57] ABSTRACT

A sub-bit line architecture for non-volatile memory devices. Four sub-bit lines are coupled to each main bit line. The sub-bit lines are approximately one half the length of the main bit lines in each sector. This sub-bit line length provides low parasitic capacitance and high signal integrity. Each sub-bit line is coupled to a main bit line through a select transistor. A column latch is coupled to each main bit line to provide program data. Data is programmed to the memory array in a page program mode. In page program mode, the selected sub-bit line applies a programming voltage to the memory cell transistor drain terminals. The drain voltage is applied to all of the memory cell transistor drains coupled to the selected sub-bit line. Since the sub-bit lines are only half the length of the main bit lines in each sector, the number of memory cell transistors coupled to each sub-bit line is about half the number coupled to sub-bit lines that are the length of the main bit line. As a result, the number of times memory cell transistors are disturbed due to increases in drain voltage caused by the sub-bit line being selected is reduced. A further advantage of the present invention is that program disturb is reduced.

9 Claims, 4 Drawing Sheets

DIVIDED BIT LINE SYSTEM FOR NON-VOLATILE MEMORY DEVICES

The present invention relates generally to non-volatile semiconductor memory devices, and more particularly to a sub-bit line architecture.

BACKGROUND OF THE INVENTION

Solid state and non-volatile memories are known in the art. Flash memory is one type of non-volatile memory. FIG. 1 illustrates a block diagram of a flash memory device. The flash memory 100 includes a memory cell array 116, data latch 118, sense amp 114, X-decoder 120, Y-decoder 122, a control logic circuit 110, and input/output buffer 112.

The operation of flash memories is well known and therefore is only briefly described herein. In one type of memory control interface, an external controller initiates a memory operation by asserting a chip enable signal (CE) and supplying address signals A0–AN (corresponding to $2^{N+1}$ memory locations) designating the address of a memory location where the operation is to be performed. If the memory operation is a program operation, the data to be programmed is provided to the addressed memory location via the bidirectional data lines D0–DK (corresponding to K+1 bit memory words). If the memory operation is a read operation, the stored information is read out from the same bidirectional data lines D0–DK. The memory 100 also provides connections for an external power supply VCC and ground (GND).

The heart of the memory 100 is cell array 116, which consists of flash memory cells. Each cell is capable of storing one bit of data, arranged in rows and columns. In the conventional manner, all of the control gates of the cells in one row are energized for a memory operation (either a read or a program) by a word line uniquely associated with that row. Typically, in a flash memory, program operations are performed a page at a time, read operations read individual bytes or words, and erase operations are performed a sector at a time. A memory operation cannot be performed unless the word line associated with the target row of cells is activated.

At least a subset of the cells in a row (typically all of the cells that store data for one memory word or byte) can be accessed simultaneously for a given memory operation via the sub-bit lines, also referred to as divided bit lines. When the memory operation is a read, the sub-bit lines are coupled to sense amplifiers that "sense" the data stored in the corresponding cells of the row whose word line is active. When the memory operation is a program operation the sub-bit lines carry the signals used to program the corresponding cells of the row associated with the active word line.

The control logic circuit 110 controls the other blocks of memory 100. Depending on the operation to be performed, the control logic issues the appropriate signals to address latch 124, data latch 118, sense amp 114 or input/output buffer 112. For the erase operation a subset of the address signals are also used to select the sector to erase.

Regardless of whether the memory operation is a read or a program, X-decoder 120 decodes the X address signal component of address signals A0–AN and activates the word line of the row that includes the memory word that is accessed in the current memory operation.

If the operation is a program operation, the input/output buffer 112 buffers the input data signals D0–DK and loads the buffered data via the bi-directional data bus to data latch 118. The data is then coupled to the sub-bit lines to program the cells comprising the word whose word line was activated for the current operation by X-decoder 120.

If the operation is a read, sense amplifiers sense the signals on the respective sub-bit lines, convert the sensed signals into binary (e.g. high or low) voltages that represent the programmed state of the addressed word and output the word's bit values to the I/O data circuit via the bi-directional bus. The output data are latched into data latch 118 and then buffered by the input/output buffer 112.

An individual flash memory cell includes a metal-oxide-semiconductor ("MOS") device having spaced-apart drain and source regions fabricated on a substrate and defining a channel region therebetween. A very thin gate oxide layer overlies the channel region, and a floating charge-retaining storage gate overlies the oxide layer. A control gate at least partially overlies the floating gate and is insulated therefrom.

In practice, a plurality of such memory cells are arrayed in addressable rows and columns to form a flash memory array. Individual cells in the array are accessed for purposes of programming, reading or erasing data by decoding row and column address information.

FIG. 2 illustrates a circuit diagram of a conventional memory sector 200 in a non-volatile memory device. A small section of the memory array comprising two main bit lines (MBLs) 210 and 211 is shown for simplicity. Similarly, only a small number of the memory array rows are illustrated. Each main bit line spans the full height of the memory array, and one main bit line typically spans many sectors stacked along the main bit line. Each main bit line has two sub-bit lines (SBLs) in each sector associated with it. Each sub-bit line is coupled to a main bit line via one of the select transistors 231–234. For example, MBL 210 is coupled to the drain of select transistor 231, and the source of transistor 231 is coupled to SBL 221. At the end of each main bit line is a column latch. The column latches 236 and 238 store program data in program mode operation. Typically the column latches for adjacent main bit lines are placed at opposite ends of the main bit lines, as illustrated in FIG. 2. Alternating the location of the column latches facilitates compact layout of the memory array.

The core of the memory array is the memory cell transistors. The memory cell transistors are represented by a transistor symbol with one additional line, added parallel to the line representing the transistor gate, for example, transistors 261–264 are memory cell transistors. The memory cell transistors have a floating gate and indicate a logic bit based on the charge stored on the floating gate.

Typically, the control gates for a group of cells in a given row are formed from a continuous strip of conductive material that defines a so-called word line, abbreviated "WL." A word line might comprise, for example, a group of eight cells that collectively store one byte, or sixteen cells that store one word. For a given column in the array, the drain leads of all cells in the column are coupled to a sub-bit line within the same sector.

Within the memory array, an individual cell is addressed and thus selected for reading or programming (writing) by specifying its row (or word line), and its column (or sub-bit line). Erase operations are performed a sector at a time. A 2 Mbit memory, for example, may comprise an array of 2048×1024 bits, in which there are 2048 word lines and 1024 sub-bit lines. Commonly, blocks of memory cells are collectively grouped into sectors. Cell addressing is accomplished by coupling address bits to precoding X-decoders and to precoding Y-decoders who respectively select the addressed word line and sub-bit lines in the array.

Programming an addressed MOS memory cell occurs in a program mode using Fowler-Nordheim ("FN") tunneling. Electrons tunnel from the floating gate through the thin gate oxide. The control gate-source threshold voltage required before substantial MOS device drain-source current occurs is affected by the amount of such charge retained on the floating gate. Thus, storage cell programming removes negative charge from the floating storage gate, and the amount of charge on the floating gate causes the cell to indicate storage of either a logic "1" or "0" in a read-out mode.

The above-described storage cells are non-volatile in that the charge on the storage gate, and thus the "0" or "1" bit stored in the cell, remains even when control and operating voltages to the array are turned off. In Fowler-Nordheim tunneling type devices, in the program (write) mode, the control gate is coupled to a large negative potential of perhaps –10 V, the drain is coupled to perhaps +5 V, the source floats, and the substrate is grounded (meaning that it is coupled to the circuit ground node). This causes electrons to be removed from the floating gate by tunneling. The drain is coupled to a voltage supply through the selected sub-bit line. Therefore the supply voltage is also applied to the other cells coupled to the selected sub-bit line. One problem with conventional cell arrays is that the drain voltage can disturb the charge in the floating gates of the other cells coupled to the selected sub-bit line. This is called drain disturb.

Another problem with conventional cell arrays is that the large program voltages required to induce electron tunneling from the floating gate can cause significant voltage levels to be capacitively coupled to adjacent unselected sub-bit lines. This coupling of voltages is referred to as program disturb. In the conventional page program memory array of FIG. 2 an unselected sub-bit line always has a selected sub-bit line on either side of it. For example, in a page program operation if control line 240 is selected, then select transistors 231, 233 and the other select transistors coupled to control line 240 are all turned on. As a result SBL 221, 223 and the subsequent odd numbered SBLs are selected. Having selected sub-bit lines on both sides of unselected sub-bit lines can cause significant program disturb coupling levels.

In a read mode, the charge stored on the floating gate of an addressed MOS memory cell may be read by coupling a voltage approximately equal to Vcc to the control gate, and reading the drain-to-source current. The presence or absence of charge on the stored gate defines a binary "1" or "0" bit that is read-out from the addressed memory cell by a sense amplifier coupled to the bit line.

In an erase mode, the electrons trapped on the floating gates of a group of addressed MOS memory cells are encouraged to flow by electron tunneling to the floating gate. During this erase mode, a group of word line decoders cause the addressed cells' control gates to be coupled to +10 V, the sources and substrates to be coupled to perhaps –8 V and the drains to float. The electrons are thereby encouraged to flow by electron tunneling to the floating gate. In flash memory devices erase operations are typically performed on an entire sector at a time.

Thus an improved non-volatile memory device that overcomes the program disturb, drain disturb and other problems of the prior art would be highly desirable.

SUMMARY OF THE INVENTION

The present invention provides an improved sub-bit line architecture for non-volatile memory devices. In one embodiment, four sub-bit lines are coupled to each main bit line in each sector. The sub-bit lines are approximately one half the length of the main bit lines within the sector. This sub-bit line length provides low parasitic capacitance and high signal integrity. Each sub-bit line is coupled to a main bit line through a select transistor. A column latch is coupled to each main bit line to provide program data.

Data is written to the memory array in a page program mode. In page program mode, the activated word line applies –10 V to the memory cells' transistor control gate terminals, the selected sub-bit line applies +5 V to the memory cells' transistor drain terminals, the memory cells' substrate terminals are grounded, and the memory cells' source terminals float. The drain voltage is applied to all of the memory cell transistor drains coupled to the selected sub-bit line. Since the sub-bit lines are only half the length of the main bit lines within the sector, the number of memory cell transistors coupled to each sub-bit line is about half the number coupled to sub-bit lines that are the length of the main bit line within the sector. As a result, the number of times memory cell transistors are disturbed due to increases in drain voltage caused by the sub-bit line being selected is reduced. The smaller number of memory cell transistors on each sub-bit line means there are a smaller number of memory cell transistors that are disturbed each time a memory cell transistor is programmed.

A further advantage of the present invention is that program disturb is reduced. Program disturb is the capacitive coupling of voltage from a selected sub-bit line to an unselected sub-bit line. In program operations only one sub-bit line per main bit line is selected. With four sub-bit lines coupled to each main bit line in each sector, an unselected sub-bit line is next to at most one selected sub-bit line. This provides reduced program disturb compared to memory arrays wherein an unselected sub-bit line can have selected sub-bit fines on both sides.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENTS

Figure 3:
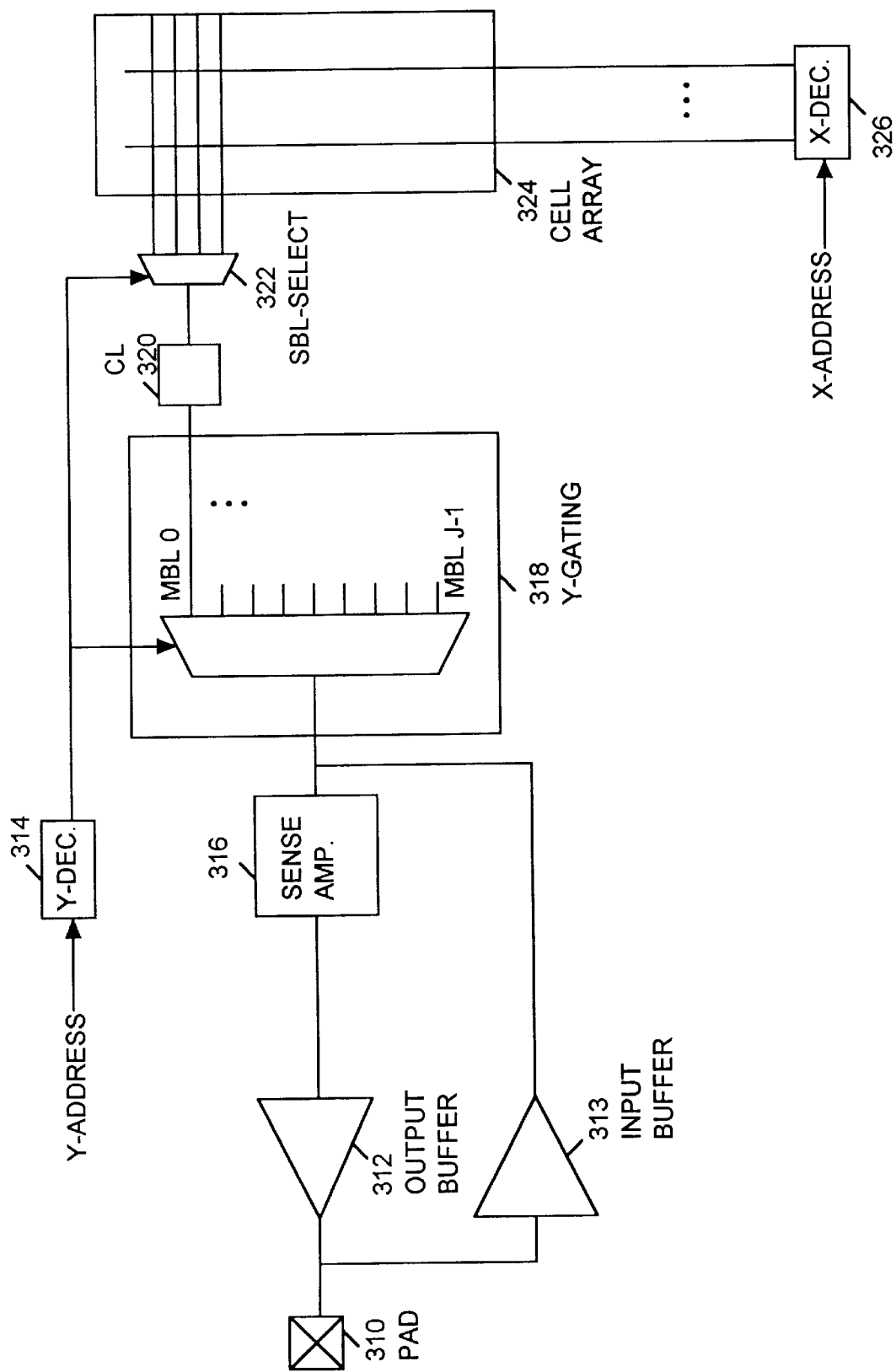
FIG. 3 illustrates a block diagram of one I/O component of a non-volatile memory adevice in which the present invention can be implemented.
Figure 4:
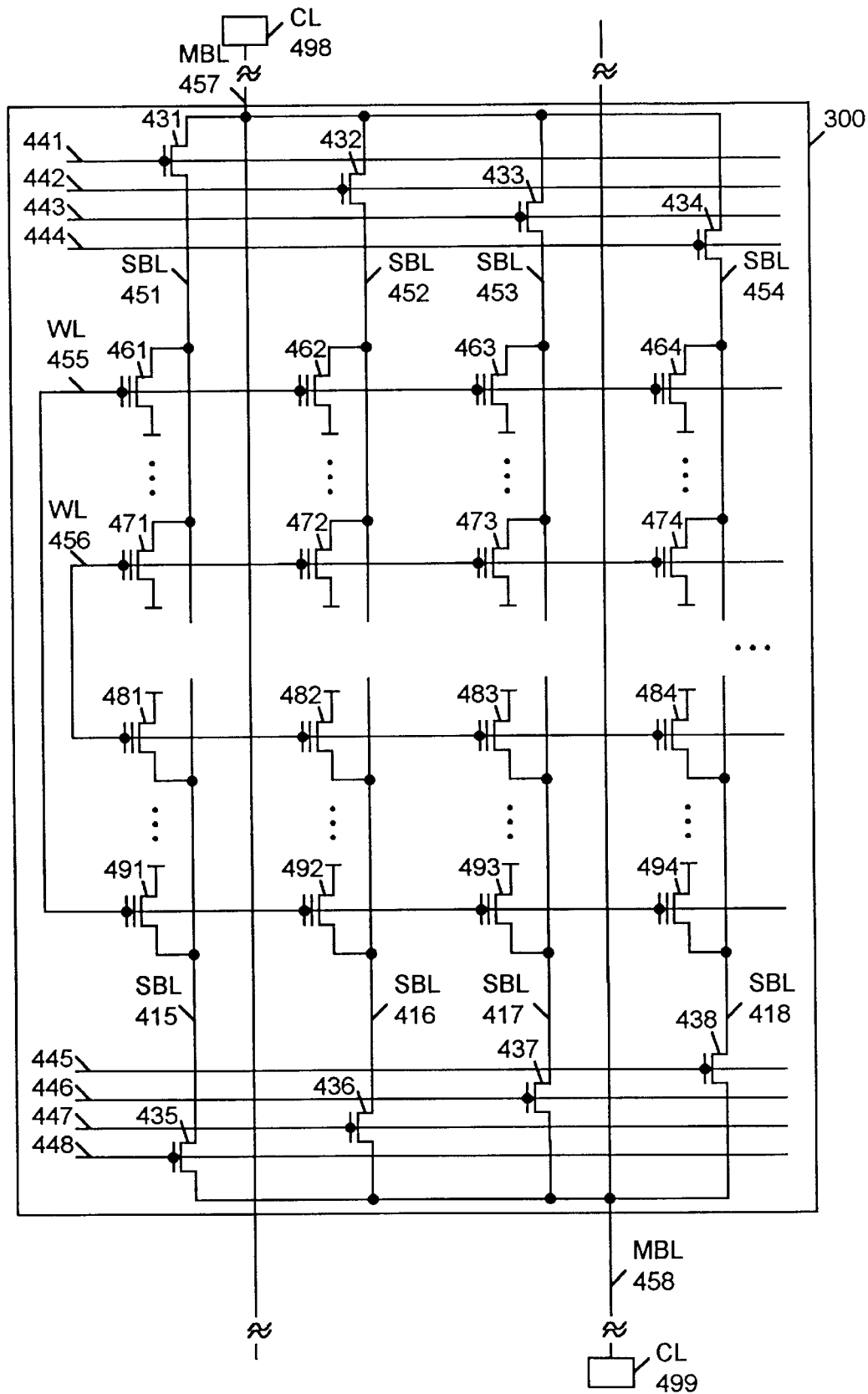
FIG. 4 illustrates a circuit diagram of a sector in a memory array of a non-volatile memory device according to one embodiment of the present invention.

FIG. 3 illustrates a block diagram of a non-volatile memory device in which the present invention can be implemented. The memory device includes a Y-decoder 314. The output of Y-decoder 314 provides a control signal for Y-gating 318 and SBL-select 322. The output of Y-gating 318 is comprised of J main bit lines (MBLs) labeled 0 to J–1. Each main bit line is coupled to a column latch 320. The output of column latch 320 is coupled to SBL-select 322. The output of SBL-select 322 are sub-bit lines (SBLs). The sub-bit lines are coupled to the memory cells in cell array 324. FIG. 4 illustrates a sector 300 in a memory array according to one embodiment of the present invention.

Memory sector 300 includes a large number of main bit lines. For example, in one embodiment sector 300 is a 64 Kbit sector. To avoid unnecessary complexity two main bit lines 457 and 458 are illustrated in FIG. 4. At the end of each main bit line is a column latch. For efficient layout of the memory device, column latches of adjacent main bit lines are placed at opposite ends, as shown by column latches 498 and 499. The column latches store data that is to be programmed to the memory cells. The column latches are collectively referred to as a page buffer. The memory array may be comprised of a plurality of sectors stacked vertically, in other words if a Y-axis is defined to be parallel to the main bit lines, then the sectors are stacked along the Y-axis. A sector is defined as a group of memory cell transistors that all have the same W substrate connection. The width of a sector is typically the same as the length of the word line. Typical numbers of word lines in a sector are 32, 64, 128 or 256, although other sector sizes are also used. Select transistors 431–434 comprise an SBL-select multiplexer 322 for sub-bit lines 451–454. Similarly select transistors 435–438 comprise an SBL-select multiplexer for sub-bit lines 415–418. The select transistors are N-channel transistors. Each main bit line is coupled to the drain terminal of four select transistors within each sector. For example, main bit line 457 is coupled to the drain terminals of select transistors 431–434.

Figure 1:
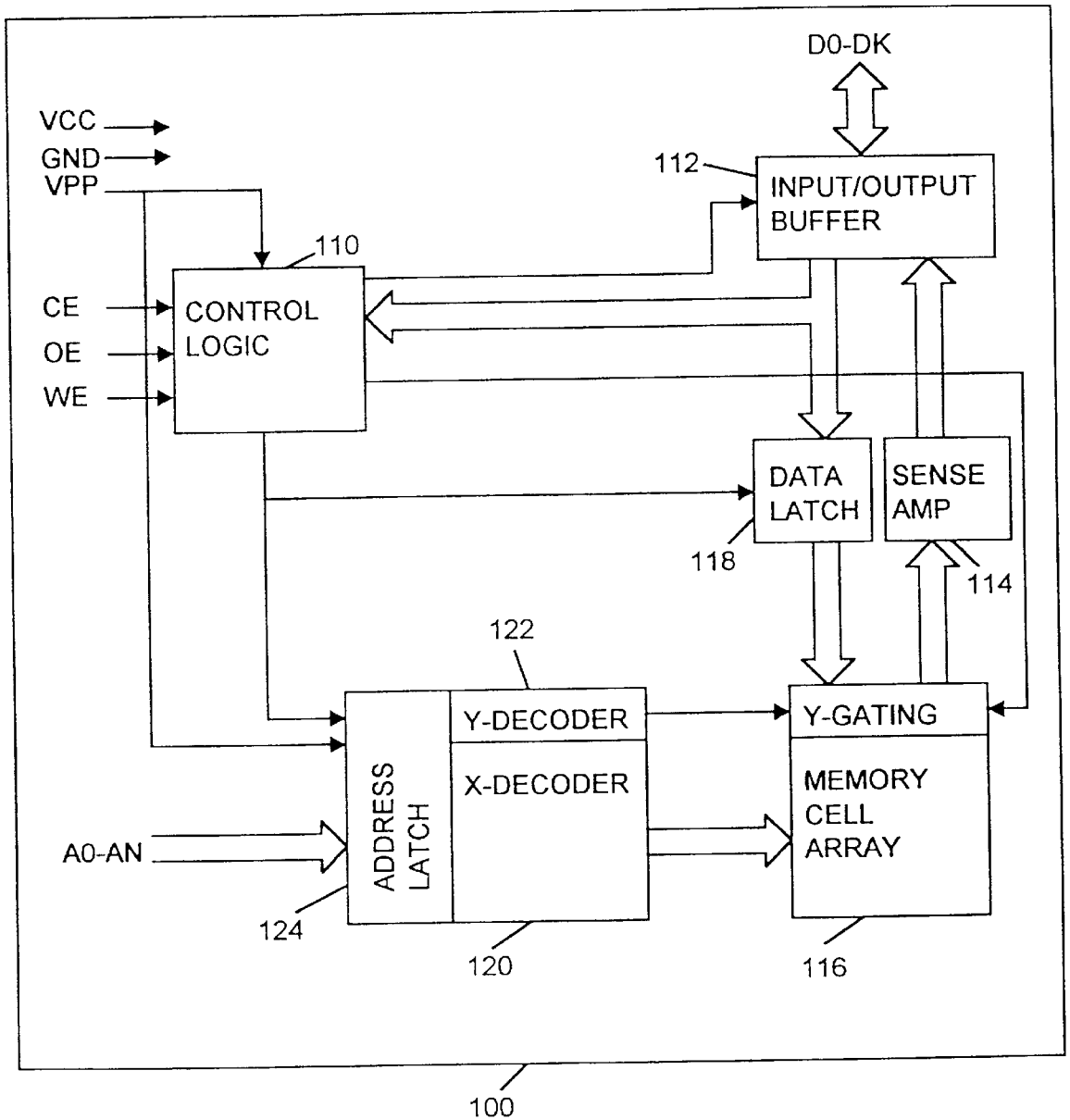
FIG. 1 illustrates a block diagram of a conventional flash memory device.
Figure 2:
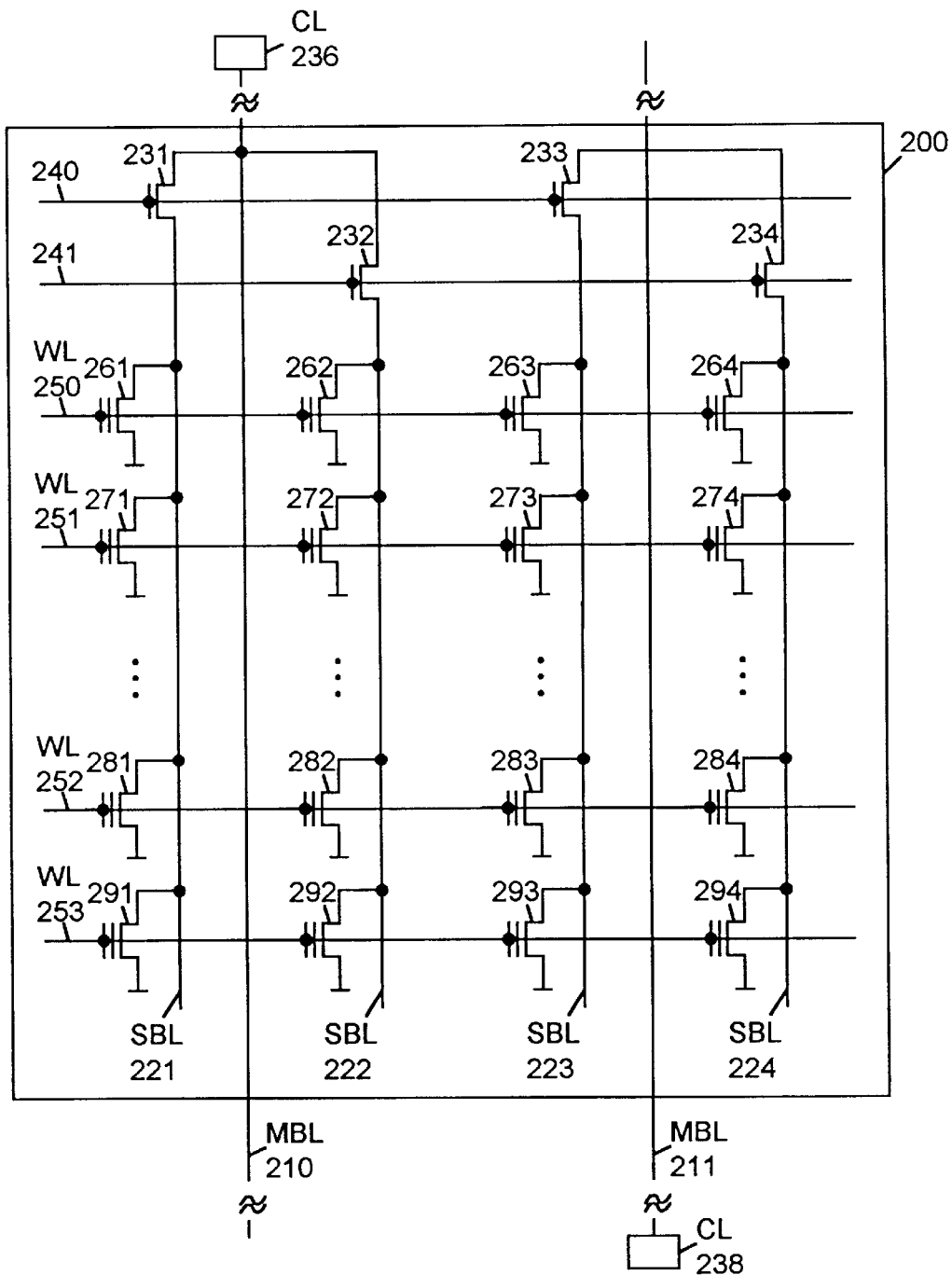
FIG. 2 illustrates a circuit diagram of a conventional memory sector in a non-volatile memory device.

In this embodiment, each main bit line has four associated sub-bit lines in each sector. For example, associated with main bit line 457 are sub-bit lines 451–454. If the main bit lines are consecutively numbered, then the sub-bit lines associated with the odd numbered main bit lines, such as MBL 457, are located in the upper half of memory sector 300, and sub-bit lines associated with even numbered main bit lines are located in the lower half of memory sector 300, or vice versa. In the FIG. 4 embodiment, the sub-bit lines only span approximately half the length of the main bit lines within each sector. The sub-bit lines of the FIG. 4 embodiment are thus approximately one half the length of the sub-bit lines in a conventional memory sector of comparable size and density, as illustrated in FIG. 2. The length of the sub-bit lines can also be described in terms of the number of memory cells coupled to each sub-bit line. In the FIG. 4 embodiment, each sub-bit line is coupled to approximately one half the number of memory cells in a column of memory cells within the sector. The shorter sub-bit lines of the present invention therefore have lower parasitic capacitance and improved performance. The drain terminal of each memory cell transistor is coupled to a sub-bit line. Each of the sub-bit lines is also coupled to the source terminal of one of the select transistors. To select a sub-bit line the select transistor coupled to the sub-bit line is turned on.

Four word lines (WLs) 455, 456, 481 and 491 are illustrated in memory sector 300. The word lines provide control signals to the memory transistor cell gate terminals for read, program and erase operations. Each word line is coupled to the control gate terminal of each of the memory cell transistors in a row. The word lines are oriented perpendicular to the main bit lines and sub-bit lines. In one embodiment word lines in the upper portion and the lower portion of the memory sector are coupled. Each word line in the lower portion of memory sector 300 is coupled to the word line in the upper portion of the memory sector that is the same distance from its associated select transistors. For example, word line 455 is coupled to the control gate terminals of memory cell transistors 461–464 in the upper portion of memory sector 300 which are adjacent to select transistors 431–434, and word line 455 is also coupled to the control gate terminals of memory cell transistors 491–494. Since the row of memory cell transistors 461–464 and the row of memory cell transistors 491–494 are all controlled by the same word line they are all controlled by the same decoded signal. For simplicity, only two word lines are illustrated in memory sector 300, an actual memory sector comprises a large number of word lines. For example, there may be one word line for each group of 128 words in the memory sector.

The memory cell transistors 461–464, 471–474, 481–484 and 491–494 are floating gate metal-oxide-semiconductor (MOS) memory cells. The memory cells have spaced-apart drain and source regions fabricated on a substrate and defining a channel region therebetween. A very thin gate oxide layer overlies the channel region, and a floating charge-retaining storage gate overlies the oxide layer. A control gate at least partially overlies the floating gate and is insulated therefrom. The source terminals of the memory cell transistors are coupled to the source node as indicated by the single bar symbol. The present invention may also be implemented with other types of non-volatile memory devices, including for example, $E^2$PROM and EPROM.

To read data from an address in the memory sector, an X-address, also called a row address, is provided to X-decoder 326 and a Y-address, also called a column address, is provided to Y-decoder 314. In each sector there are many main bit lines and sub-bit lines. The main bit lines are selected using Y-gating 318, illustrated in FIG. 3. For simplicity, only one I/O component, of the many I/O components in an actual memory device is illustrated in FIG. 3. Y-gating 318 is coupled to sense amp 316. Sense amp 316 drives buffer 312, which in turn drives output pad 310. For each I/O only one main bit line is read at a time and only one sub-bit line per main bit line is selected at a time. The Y-address determines the main bit line and sub-bit line that is selected, and the X-address determines the sector and the word line in that sector that is selected. The select transistors of sub-bit lines of the addressed memory cells are turned on. With the select transistor of a selected sub-bit line turned on a path is established from the memory cell transistor drains to the sub-bit line, through the select transistor to the main bit line, and through Y-gating 318 to sense amp 316. The shorter sub-bit lines of the present invention enhance read performance by reducing capacitive loading which increases the read speed and improves the signal integrity.

The word line of the addressed row of memory cells is activated. Activating the word line may comprise forcing the word line to about the Vcc voltage level. The amount of charge retained in the floating gate determines whether the memory cell is turned on when the corresponding word line is activated. If a memory cell coupled to a sub-bit line is turned on then current flows from the sub-bit line through the drain of the memory cell transistor to the source node. The current is sensed to determine whether the memory cell transistor is on or off which indicates the polarity of the bit.

In page program mode the column latches are loaded with data to be programmed. After the column latches are loaded, one of the four sub-bit lines for each main bit line to be programmed is selected by turning on the corresponding select transistor. With the select transistor on, a signal path is established from the column latch through the select transistor to the drain terminal of memory cells coupled to the selected sub-bit line. The unselected bit lines are floating. In an alternative embodiment, the unselected bit lines are grounded, however this requires additional circuitry. In page program memory devices there is a column latch for each main bit line. In non-page program memory devices one data latch is used for all of the main bit lines associated with the same I/O. In these non-page program memory devices only one main bit line in each group of main bit lines coupled to the same data latch is programmed at a time. By contrast, in page program memory devices all the main bit lines can be programmed at the same time because one column latch is coupled to each main bit line.

Units of memory smaller than a page can be changed using page program mode. This can be done by saving the desired contents of the sector in which the memory address is contained; erasing the sector; then loading the saved data into a page buffer along with the new data, and programming the sector. Page size varies widely and depends on the architecture. In one embodiment, a page is comprised of 128 16 bit words.

In page program operation the increase in voltage of the selected sub-bit line can create noise on the adjacent sub-bit lines. This undesired capacitive signal coupling between the sub-bit lines is called program disturb. To minimize the size of the memory sector it is desirable to make the sub-bit lines as close together as possible. To program the memory cells the selected sub-bit line voltage is set to a program voltage. In a Fowler-Nordheim tunneling embodiment, to program a memory cell, the memory cell control gate is coupled to a large negative potential of perhaps −10 V, the drain is coupled to +5 V, the source floats, and the substrate is grounded. This causes electrons to tunnel from the floating gate. In a channel hot electron embodiment the memory cells are programmed by accelerating hot electrons from the device substrate. The amount of charge retained on the floating gate determines the control gate-source threshold voltage required before substantial MOS device drain-source current occurs, which in turn determines whether the cell is read as a "1" or a "0" in a subsequent read operation.

In the FIG. 4 embodiment, there are four sub-bit lines in each sector for each main bit line. Because only one sub-bit line is selected in a program operation for each main bit line, the sub-bit lines on either side of each selected sub-bit line are unselected. In contrast in the conventional memory sector of FIG. 2, an unselected sub-bit line may have selected sub-bit lines on both sides. Having at most one selected sub-bit line next to an unselected sub-bit line in the present invention reduces program disturb by reducing coupling between sub-bit lines.

The sub-bit line architecture of the present invention also reduces drain disturb. One row of memory cell transistors are programmed at a time. Therefore, in a program operation when the sub-bit line voltage is raised to the program voltage, this voltage is applied to the drain terminals of all of the memory cell transistors coupled to the sub-bit line. The activated word line of the addressed memory cell transistor causes the addressed memory cell transistor to be programmed. However, the high program voltage at the drains of the other memory cell transistors coupled to the selected sub-bit line can disturb the charge stored in the floating gate. This undesired effect is called drain disturb. The present invention reduces drain disturb by reducing the number of memory cell transistors on a sub-bit line. This reduces the number of times each sub-bit line is programed and thereby reduces the average number of times a memory cell transistor is disturbed for a given number of program operations.

In an erase mode, the electrons trapped on the floating gates of a group of addressed MOS memory cells are encouraged to flow by electron tunneling to the floating gate. During this erase mode, a group of word line decoders cause the addressed cells' control gates to be coupled to +10 V, the sources and substrates to be coupled to perhaps −8 V and the drains to float. Memory cell transistors are erased a sector at a time. This is because there is one substrate connection for all of the memory cell transistors in a sector.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

Thus a divided bit line system for non-volatile memory devices has been described.

What is claimed is:

1. A non-volatile memory device having at least one sector, said sector comprising:

a plurality of main bit lines;

a plurality of sub-bit lines, wherein at least four sub-bit lines in said sector are coupled to each of said main bit lines in said sector;

a plurality of memory cell transistors, said memory cell transistors coupled to said sub-bit lines;

a plurality of word lines coupled to said memory cell transistors;

a control logic circuit coupled to said sub-bit lines, wherein said control logic circuit selects said sub-bit lines;

wherein each of a plurality of said sub-bit lines has a length of at most approximately one half of the length, in said sector, of the main bit line corresponding to said sub-bit line;

said sub-bit lines have a length of at most approximately one half of the length of the memory sector alone an axis parallel to said sub-bit lines;

said plurality of memory cell transistors are arranged in a plurality of rows, said plurality of rows is further divided into a first group of contiguous rows and a second group of contiguous rows; and each of said rows in said first group is coupled by a shared word line to a row in a corresponding position in said second group.

2. The non-volatile memory device of claim 1 wherein said corresponding position of said second group row comprises a second group row which is approximately the same distance from a central axis of said memory sector as is said first group row to which said second group row is coupled.

3. A non-volatile memory device having at least one sector, said sector comprising:

a plurality of main bit lines;

a plurality of sub-bit lines, wherein at least four sub-bit lines in said sector are coupled to each of said main bit lines in said sector;

a plurality of memory cell transistors, said memory cell transistors coupled to said sub-bit lines;

a plurality of word lines coupled to said memory cell transistors;

a control logic circuit coupled to said sub-bit lines, wherein said control logic circuit selects said sub-bit lines;

wherein each of a plurality of said sub-bit lines has a length of at most approximately one half of the length, in said sector, of the main bit line corresponding to said sub-bit line;

said sub-bit lines have a length of at most approximately one half of the length of the memory sector along an axis parallel to said sub-bit lines; and in a page program mode at most one sub-bit line of said at least four sub-bit lines, in said sector, coupled to a main bit line is selected at a time.

4. The non-volatile memory device of claim 3 wherein said non-volatile memory comprises a flash memory.

5. A non-volatile memory device having at least one sector, said sector comprising:

a plurality of column latches;

a plurality of control lines;

a plurality of word lines;

a plurality of sub-bit lines;

a plurality of main bit lines, each of said main bit lines in said sector coupled to at least four sub-bit lines in said sector, and each of said main bit lines coupled to one of said column latches;

at least four select transistors each having a first, a second, and a third terminal, said first terminal of each of said at least four select transistors coupled to said main bit line, said second terminal of each of said select transistors coupled to one of said control lines, said third terminal of each of said select transistors coupled to one of said sub-bit lines;

a plurality of memory cell transistors each having a first, a second and a third terminal, said first terminal of each of said memory cell transistors coupled to one of said sub-bit lines, and said second terminal of each of said memory cell transistors coupled to one of said word lines;

wherein each of a plurality of said sub-bit lines has a length of at most approximately one half of the length, in said sector, of the main bit line corresponding to said sub-bit line;

said sub-bit lines have a length of at most approximately one half of the length of the memory sector along an axis parallel to said sub-bit lines;

said plurality of memory cell transistors are arranged in a plurality of rows, said plurality of rows is further divided into a first group of contiguous rows and a second group of contiguous rows, and each of said rows in said first group is coupled by a shared word line to a row in a corresponding position in said second group.

6. The non-volatile memory device of claim 5 wherein said corresponding position of said second group row comprises a second group row which is approximately the same distance from a central axis of said memory sector as is said first group row to which said second group row is coupled.

7. A non-volatile memory device having at least one sector, said sector comprising:

a plurality of column latches;

a plurality of control lines;

a plurality of word lines;

a plurality of sub-bit lines;

a plurality of main bit lines, each of said main bit lines in said sector coupled to at least four sub-bit lines in said sector, and each of said main bit lines coupled to one of said column latches;

at least four select transistors each having a first, a second, and a third terminal, said first terminal of each of said at least four select transistors coupled to said main bit line, said second terminal of each of said select transistors coupled to one of said control lines, said third terminal of each of said select transistors coupled to one of said sub-bit lines;

a plurality of memory cell transistors each having a first, a second and a third terminal, said first terminal of each of said memory cell transistors coupled to one of said sub-bit lines, and said second terminal of each of said memory cell transistors coupled to one of said word lines;

wherein each of a plurality of said sub-bit lines has a length of at most approximately one half of the length, in said sector, of the main bit line corresponding to said sub-bit line said sub-bit lines have a length of at most approximately one half of the length of the memory sector along an axis parallel to said sub-bit lines; and in a page program mode at most one sub-bit line of said at least four sub-bit lines, in said sector, coupled to a main bit line is selected at a time.

8. The non-volatile memory array of claim 7 wherein said non-volatile memory comprises a flash memory.

9. The non-volatile memory device of claim 7 wherein said sector further comprises a plurality of columns of memory cells, a first sub-bit line of said plurality of sub-bit lines is coupled to approximately one half of the number of memory cells in a first column, and a second sub-bit line of said plurality of sub-bit lines is coupled to approximately one half of the number of memory cells in said first column.

* * * * *